(12) United States Patent
Ishizuki

(10) Patent No.: US 9,888,575 B2
(45) Date of Patent: Feb. 6, 2018

(54) ELECTRONIC DEVICE AND METHOD FOR MANUFACTURING ELECTRONIC DEVICE

(71) Applicant: FUJITSU LIMITED, Kawasaki-shi, Kanagawa (JP)

(72) Inventor: Yoshikatsu Ishizuki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/413,714

(22) Filed: Jan. 24, 2017

(65) Prior Publication Data
US 2017/0257948 A1    Sep. 7, 2017

(30) Foreign Application Priority Data

Mar. 4, 2016 (JP) .................. 2016-042735

(51) Int. Cl.
| | |
|---|---|
| H05K 1/00 | (2006.01) |
| H05K 1/16 | (2006.01) |
| H05K 1/11 | (2006.01) |
| H05K 7/00 | (2006.01) |
| H05K 1/14 | (2006.01) |
| H05K 1/02 | (2006.01) |
| H05K 1/18 | (2006.01) |
| H05K 3/36 | (2006.01) |

(52) U.S. Cl.
CPC ............ H05K 1/147 (2013.01); H05K 1/028 (2013.01); H05K 1/181 (2013.01); H05K 3/361 (2013.01); *H05K 2201/042* (2013.01)

(58) Field of Classification Search
CPC ........ H05K 1/147; H05K 1/028; H05K 1/181; H05K 3/361; H05K 2201/042

USPC .................. 174/254, 260, 267; 361/749, 760
See application file for complete search history.

(56) References Cited

U.S. PATENT DOCUMENTS

| | | | | |
|---|---|---|---|---|
| 5,290,971 A | * | 3/1994 | Hamaguchi | H01L 23/13 174/250 |
| 6,084,780 A | * | 7/2000 | Happoya | H05K 1/141 257/686 |
| 6,663,400 B1 | * | 12/2003 | Yokoyama | H05K 1/147 174/88 R |

FOREIGN PATENT DOCUMENTS

| | | |
|---|---|---|
| JP | H03-174757 | 7/1991 |
| JP | H04-208588 | 7/1992 |
| JP | 2001-156407 A1 | 6/2001 |

* cited by examiner

*Primary Examiner* — Sherman Ng
(74) *Attorney, Agent, or Firm* — Kratz, Quintos & Hanson, LLP

(57) ABSTRACT

An electronic device includes: a wiring substrate; a plurality of components having different heights mounted on one surface of the wiring substrate; and a flexible substrate, the flexible substrate being formed by laminating on a one surface side of the wiring substrate, that covers the plurality of components, the flexible substrate including a first portion that covers, among the plurality of components, one or more first components that have heights that are equivalent to or lower than a first height, and a second portion that covers, among the plurality of components, one or more second components other than the one or more first components, a first rigidity of the first portion being higher than a second rigidity of the second portion.

6 Claims, 11 Drawing Sheets

ELECTRONIC DEVICE AND METHOD FOR MANUFACTURING ELECTRONIC DEVICE

CROSS-REFERENCE TO RELATED APPLICATION

This application is based upon and claims the benefit of priority of the prior Japanese Patent Application No. 2016-042735, filed on Mar. 4, 2016, the entire contents of which are incorporated herein by reference.

FIELD

The embodiments discussed herein are related to an electronic device and a method for manufacturing the electronic device.

BACKGROUND

Conventionally, there is a hybrid integrated circuit device including two integrated circuit substrates that face each other, conducting paths having desired shapes formed on opposing main surfaces of the substrates, and a microcomputer that is connected to the conducting paths and that has a desired control function. The hybrid integrated circuit device further includes peripheral circuit elements to which a predetermined control output signal is fed from the microcomputer and that is connected to the conducting paths on the substrates, and an integrated case member disposed between the two substrates. A hole is formed in one of the substrates at a desired position and a wiring substrate on which the microcomputer is mounted is accommodated and is disposed in the space formed by the hole.

Incidentally, in the conventional hybrid integrated circuit device, since the two integrated circuit substrates are disposed so as to face each other, there is a great deal of space between the two integrated circuit substrates in which no circuit element and the like are disposed, and high density mounting is not sufficiently achieved.

The following is a reference document.
[Document 1] Japanese Laid-open Patent Publication No. 03-174757.

SUMMARY

According to an aspect of the invention, an electronic device includes: a wiring substrate; a plurality of components having different heights mounted on one surface of the wiring substrate; and a flexible substrate, the flexible substrate being formed by laminating on a one surface side of the wiring substrate, that covers the plurality of components, the flexible substrate including a first portion that covers, among the plurality of components, one or more first components that have heights that are equivalent to or lower than a first height, and a second portion that covers, among the plurality of components, one or more second components other than the one or more first components, a first rigidity of the first portion being higher than a second rigidity of the second portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an electronic device according to an embodiment of the present disclosure and a method for manufacturing the electronic device will be described.

Embodiment

Figure 1:
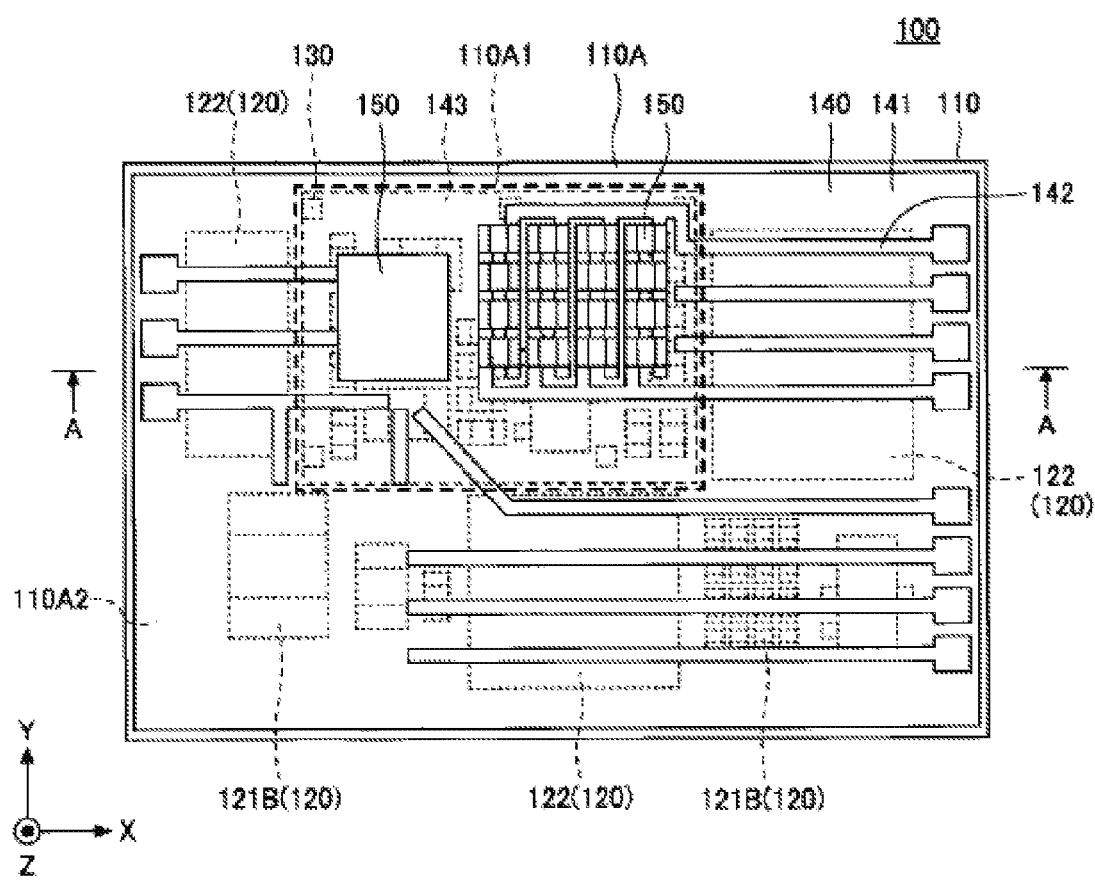
FIG. 1 is a diagram illustrating an electronic device of an embodiment.
Figure 2:
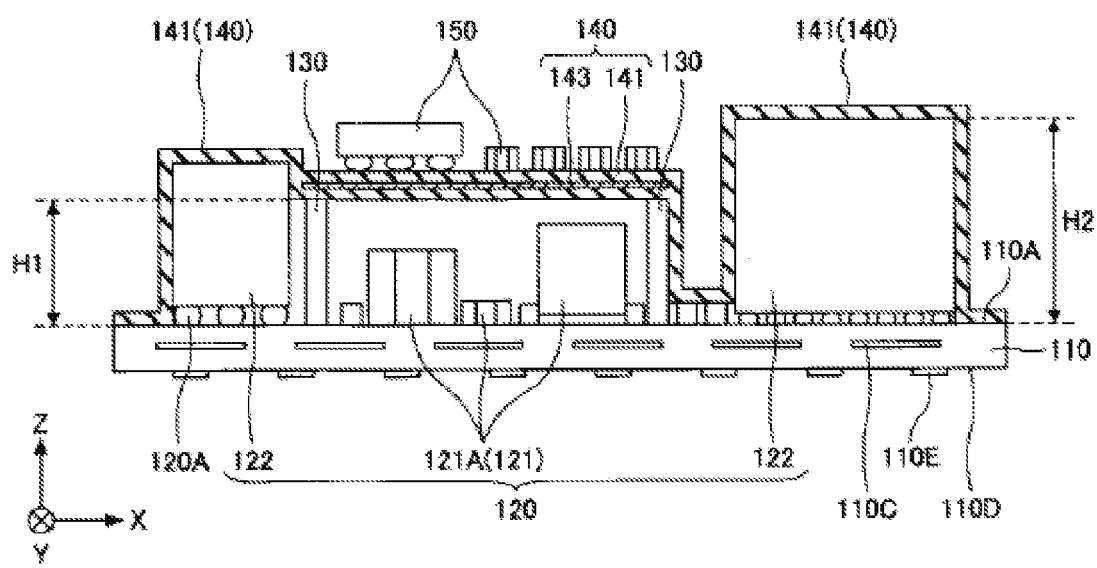
FIG. 2 is a diagram illustrating the electronic device of the embodiment.

FIGS. 1 and 2 are diagrams illustrating an electronic device 100 of the embodiment. FIG. 1 is a plan view, and FIG. 2 is a cross-sectional arrow view taken along line A-A. Hereinafter, the present embodiment will be defined through an XYZ coordinate system that is an orthogonal coordinate system.

The electronic device 100 includes a wiring substrate 110, components 120, support posts 130, a flexible substrate 140, and components 150.

Hereinafter, the description will be given with reference to, in addition to FIGS. 1 and 2, FIGS. 3 to 6.

Figure 3:
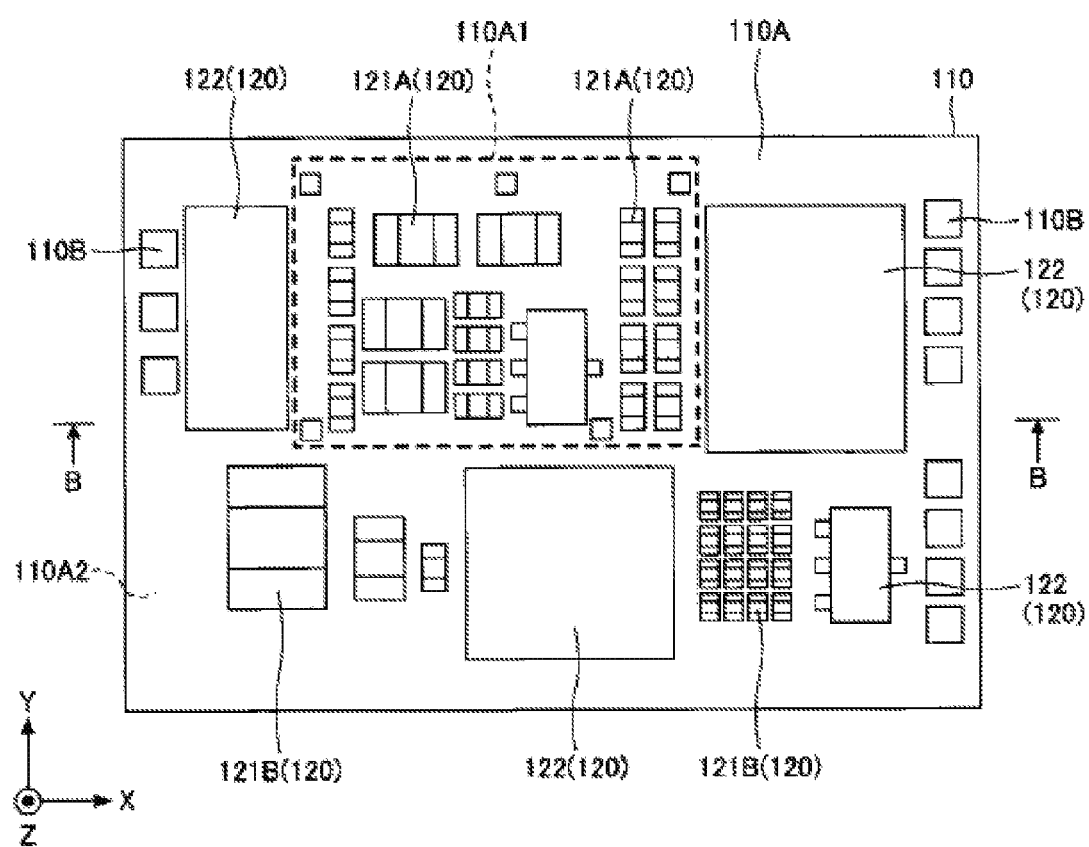
FIG. 3 is a plan view illustrating a wiring substrate, components, and support posts.
Figure 4:
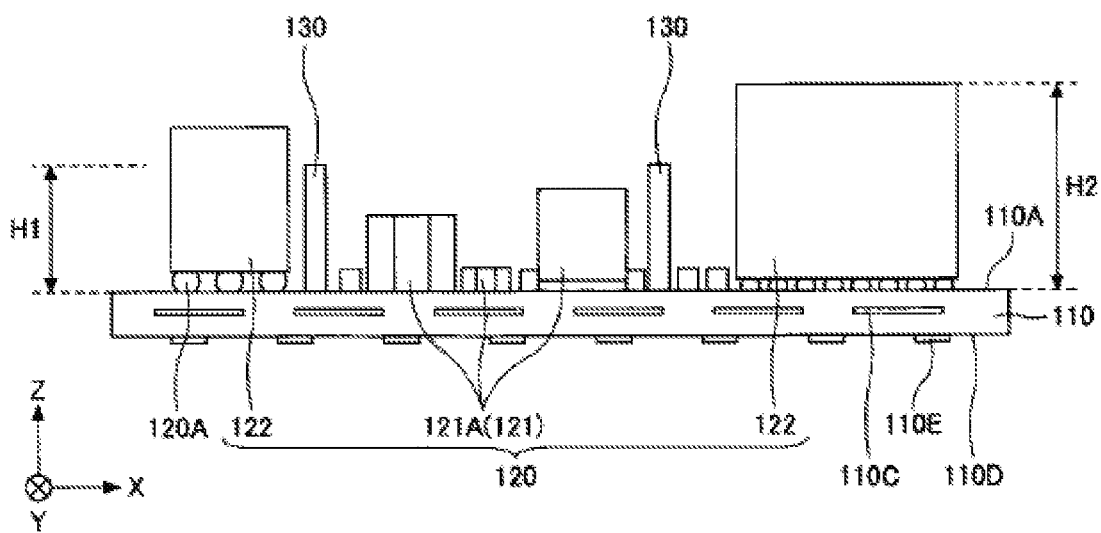
FIG. 4 is a cross-sectional view taken along line B-B in FIG. 3.
Figure 5:
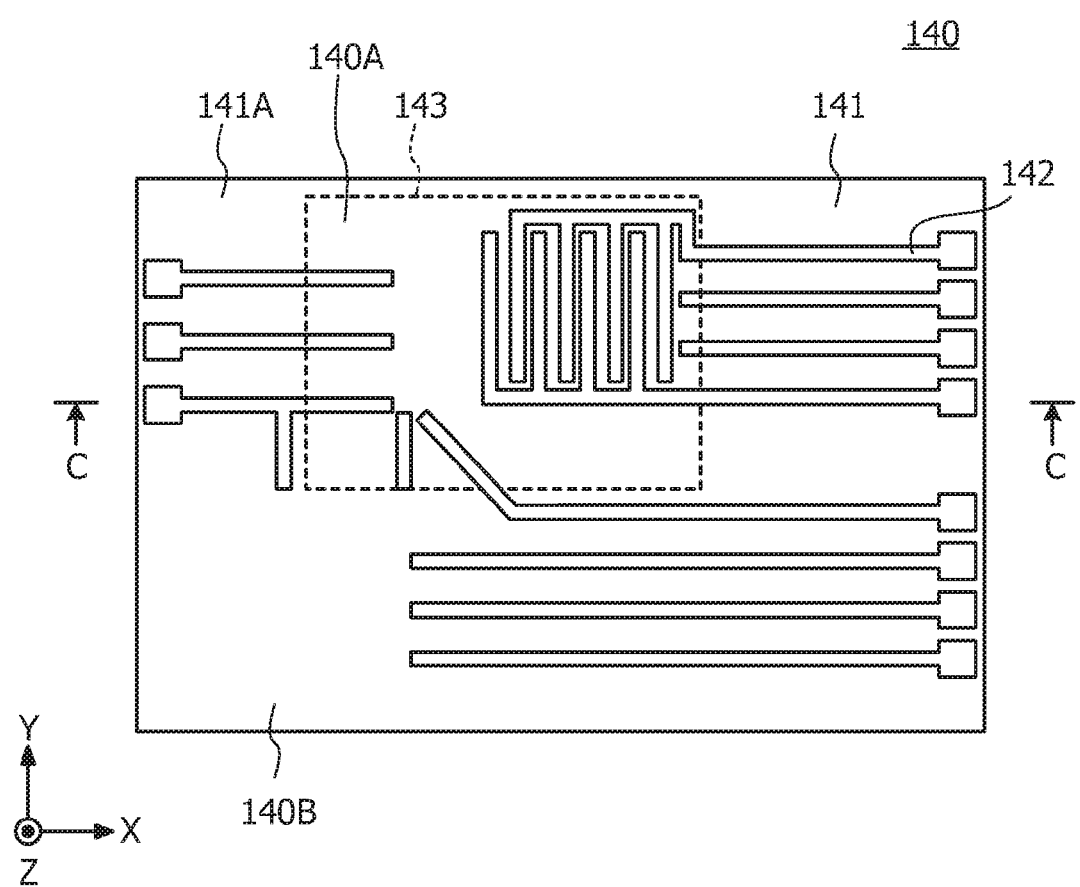
FIG. 5 is a plan view of a flexible substrate.
Figure 6:
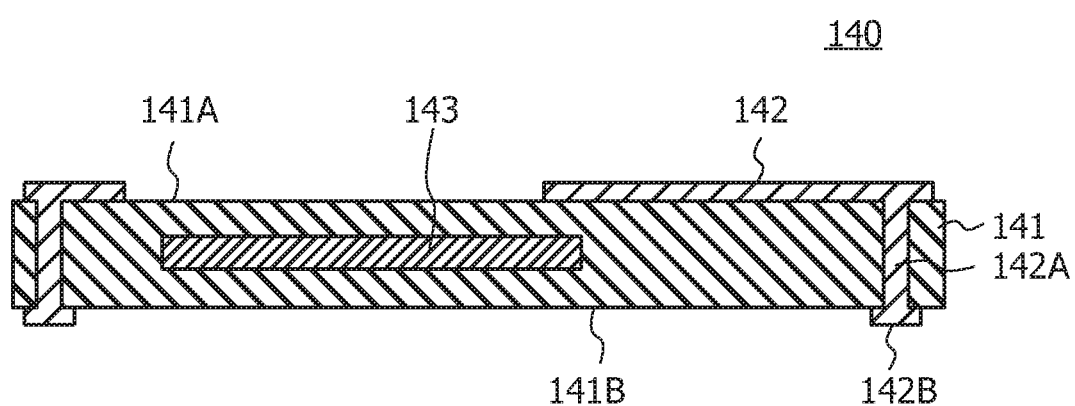
FIG. 6 is a cross-sectional view taken along line C-C in FIG. 5.

FIG. 3 is a plan view illustrating the wiring substrate 110, the components 120, and the support posts 130, and FIG. 4 is a cross-sectional arrow view taken along line B-B in FIG. 3. FIG. 5 is a plan view illustrating the flexible substrate 140, and FIG. 6 is a cross-sectional arrow view taken along ling C-C in FIG. 4.

The electronic device 100 is disposed inside a housing of, for example, a smart phone terminal, a tablet computer, a wearable terminal, or a portable game machine.

The wiring substrate 110 is a wiring substrate for mounting the components 120, and is a so-called rigid substrate including a base material serving as an insulator and a wiring layer. The wiring substrate 110 is used as a motherboard of the electronic device 100. A Flame Retardant Type 4 (FR4) wiring substrate may be used as the wiring substrate 110.

Pads 110B are disposed on a surface 110A of the wiring substrate 110. The pads 110B are connected to wiring 110C formed on an inner layer of the wiring substrate 110 or to wiring 110E on a back side 110D.

The components 120 are electronic components, a battery, other components, and the like that are mounted on the surface 110A of the wiring substrate 110. The electronic components are, for example, an integrated circuit (IC) chip, a chipset, a memory, a capacitor, a coil, a resistor, and the like. The components 120 are connected to the wiring 110C or 110E of the wiring substrate 110. Some of the components 120 are, for example, mounted by flip chip bonding using bumps 120A.

The components 120 include components 121 that have heights that are equivalent to or lower than H1, which is a height from the surface 110A of the wiring substrate 110, and components 122 that have heights that are higher than H1. Both the components 121 and 122 are disposed in plural numbers. It is assumed that H2 is a height of a component 122 that has the highest height among the plurality of components 122.

The components 121 may be distinguished into components 121A and 121B. For example, the components 121A are disposed at the middle portion in the X-axis direction and inside an area 110A1 on a Y-axis positive direction side. The components 121 are an example of one or more first components, and the area 110A1 is an example of a first area.

The components 122 are disposed in an area 110A2 that surrounds the area 110A1 in which the components 121A are mounted. The components 122 are an example of one or more second components, and the area 110A2 is an example of a second area. Other than the components 122, the components 121B are also disposed in the area 110A2.

The support posts 130 are columnar members that extend from the surface 110A in a Z-axis positive direction inside the area 110A1. The support posts 130 are disposed around the components 121A. Furthermore, the height of the support posts 130 is H1. Herein, five support posts 130 are disposed as an example. Among the five support posts 130, four support posts 130 are disposed in the four corners of the rectangular area 110A1.

The support posts 130 are disposed so as to support the flexible substrate 140. The support posts 130 are formed of an insulator, such as plastic, or metal, such as aluminum. In a case in which the support posts 130 are formed of metal, the support posts 130 may be insulated from the wiring of the wiring substrate 110 and the components 120 such that there is no effect on the electrical characteristic of the electronic device 100. Furthermore, when the support posts 130 are formed of metal, the support posts 130 may be used as wiring that connects the wiring of the wiring substrate 110 or the components 120, and the wiring of the flexible substrate 140 to each other.

Note that the support posts 130 disposed around the components 121A refers to the support posts 130 being disposed around the components 121A so as to surround the components 121A while not surrounding the components 121B and 122.

Furthermore, in a case in which there is a plurality of components 121A inside the area 110A1, the support posts 130, in plan view, may be positioned all outside the group of components 121A or the support posts 130, in plan view, may be positioned between the plurality of components 121A. In a case in which the support posts 130 are positioned between the plurality of components 121A, the support posts 130 are disposed around at least one of the components 121A.

Furthermore, in a case in which there is one component 121A inside the area 110A1, the support posts 130 are disposed between the one component 121A, and the components 121B or 122 outside the area 110A1.

The flexible substrate 140 includes a film 141, wiring 142, and a metal layer 143. The flexible substrate 140 is flexible and is stretched and disposed, by laminating with a laminator, so as to cover the components 120 (121 and 122) and to coincide with the heights of the components 121 and 122.

The film 141 may be any film formed of an insulator that is capable of being laminated and that has flexibility, and is, for example, a polyimide film. The film 141 is rectangular in plan view and has a size that coincide with the size of the wiring substrate 110.

The wiring 142 is disposed on a surface 141A of the film 141 (see FIGS. 5 and 6). While a detailed description of the configuration of the wiring 142 is omitted herein, the wiring 142 connects the components 150 and vias 142A disposed inside via holes that penetrate the film 141 in the Z-axis direction to each other. The vias 142A are connected to pads 142B disposed on a back side 141B of the film 141. The pads 142B are connected to the pads 110G of the wiring substrate 110 when the flexible substrate 140 is attached onto the wiring substrate 110 on which the components 120 have been mounted. Note that the wiring 142, the vias 142A, and the pads 142B are omitted in FIG. 2.

The metal layer 143 is disposed in an inner layer of the film 141. The metal layer 143 is disposed so as to reinforce the rigidity of the film 141. Accordingly, the rigidity of the portion of the film 141 where the metal layer 143 is disposed is higher than the rigidity of the portion of the film 141 where the metal layer 143 is not disposed.

Furthermore, the positon of the metal layer 143 coincides with the area 110A1. In other words, the positon of the metal layer 143 in the X-axis direction and the Y-axis direction is set so as to be inside the area 110A1 when the flexible substrate 140 is attached onto the wiring substrate 110 on which the components 120 are mounted.

Since the components 121A that have heights that are equivalent to or lower than H1 and the support posts 130 that have the height H1 are disposed inside the area 110A1, when the flexible substrate 140 is attached to the wiring substrate 110 by laminating, a flat surface with high rigidity is formed in a portion 140A where the metal layer 143 exists in the flexible substrate 140 in plan view. The portion 140A is like a scaffold that is set up on the wiring substrate 110 using the support posts 130. The portion 140A is an example of a first portion.

Since there are components 122 that have heights that are higher than H1 in the area 110A2 that surrounds the area 110A1 of the wiring substrate 110, the portion 140A is positioned lower than a portion 140B in the flexible substrate 140 where no metal layer 143 exists in plan view. The portion 140B is an example of a second portion.

The components 150 are electronic components, other components, and the like that are mounted on a surface (a surface on the Z-axis positive direction side) of the portion 140A of the flexible substrate 140. The electronic components are, for example, an IC chip, a chipset, a memory, a capacitor, a coil, a resistor, and the like. Each of the components 150 is an example of a third component.

The components 150 are connected to the wiring 142 of the flexible substrate 140. The wiring 142 is connected to the wiring 110C or 110E of the wiring substrate 110 through the vias 142A, the pads 142B, and the pads 110S.

Since the portion 140A is lower in height than the portion 140B, by mounting the components 150 on the surface of the portion 140A, the space above the area 110A1 may be used effectively. Note that, desirably, the heights of the components 150 are equivalent to or lower than the height H2 of the component 122 with the highest height so that the components 150 do not protrude on the Z-axis positive direction side with respect to the components 122.

Figure 7:
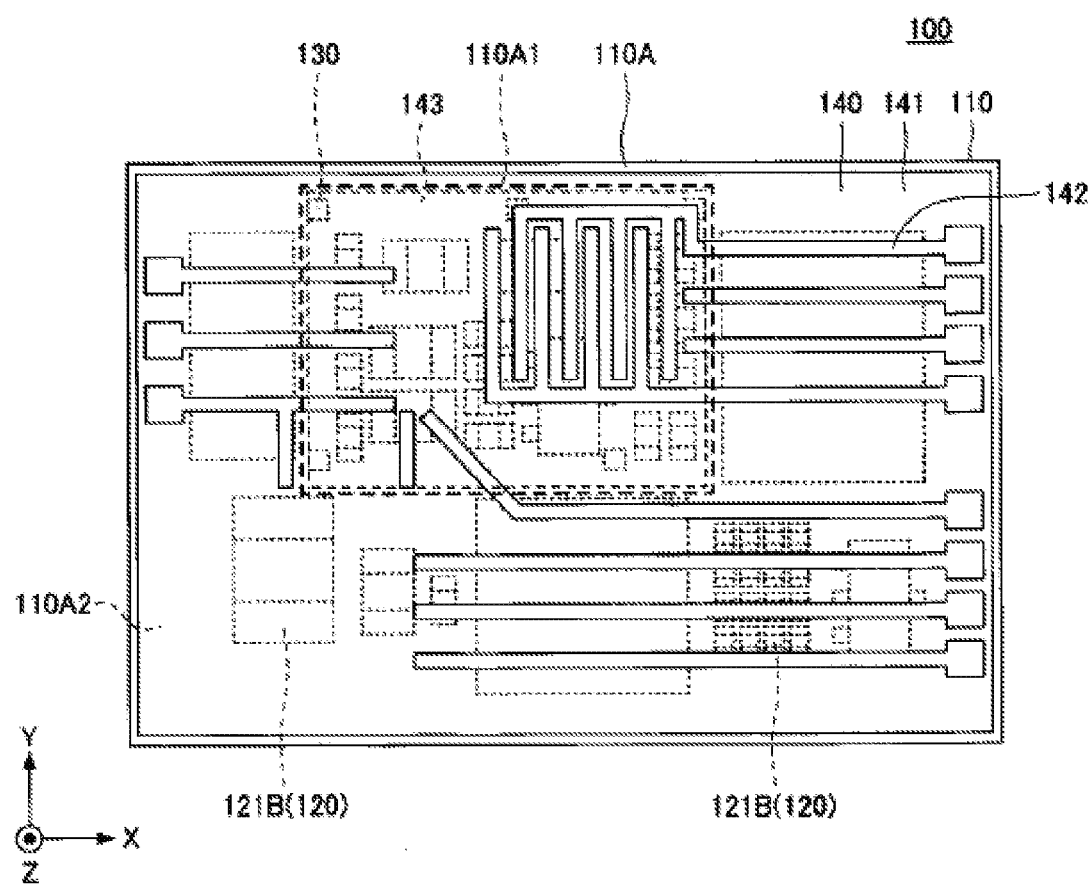
FIG. 7 is a diagram illustrating a manufacturing process of the electronic device.
Figure 8:
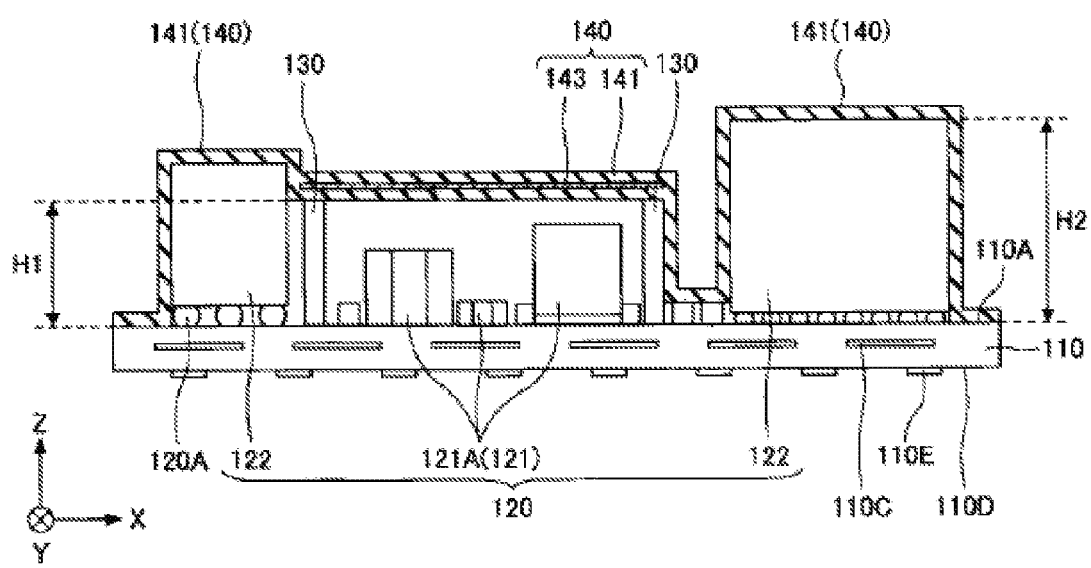
FIG. 8 is a diagram illustrating a manufacturing process of the electronic device.

A method for manufacturing the electronic device 100 will be described next. Herein, in addition to FIGS. 3 and 4, FIGS. 7 and 8 will be used. FIGS. 7 and 8 are diagrams illustrating the manufacturing process of the electronic device 100.

As illustrated in FIGS. 3 and 4, the components 120 and the support posts 130 are mounted on the surface of the wiring substrate 110. Some of the components 120 are mounted by flip chip bonding using bumps 120A.

The support posts 130 may be adhered to the surface 110A of the wiring substrate 110 with, for example, an adhesive.

Subsequently, the flexible substrate 140 is positioned with respect to the wiring substrate 110, and the pads 142B are connected to the pads 110B by soldering. When performing positioning, the position of the portion 140A of the flexible substrate 140 is aligned with the area 110A1 of the wiring substrate 110.

Furthermore, the flexible substrate 140 is attached onto the wiring substrate 110, on which the components 120 and the support posts 130 are mounted, by subsequently performing lamination while heating the flexible substrate 140 with a laminator. Note that in order to not damage the components 120, heating may be conducted at about 120° C., for example.

In laminating, the flexible substrate 140 is stretched so as to coincide with the heights of the components 120 (121 and 122), and as illustrated in FIGS. 7 and 8, the flexible substrate 140 is adhered to upper surfaces of the components 120 (121 and 122) so as to cover the components 120 (121 and 122). With the above process, the portion 140A of the flexible substrate 140 is supported by the support posts 130 and a flat surface with high rigidity is formed above the components 121A.

Moreover, ultimately, the components 150 are mounted on the surface of the portion 140A. The terminals on the underside of the components 150 may be connected to the wiring 142 by soldering or the like. Furthermore, some of the components 150 may be mounted by flip chip bonding.

The manufacturing of the electronic device 100 illustrated in FIGS. 1 and 2 is completed with the process described above.

As described above, in the present embodiment, a portion of the film 141 of the flexible substrate 140 is reinforced with the metal layer 143, the portion 140A is disposed in the flexible substrate 140, and the portion 140A is disposed above the components 121A that have heights that are equivalent to or lower than H1.

Since the portion 140A is lower in height than the portion 140B therearound, by mounting the components 150 on the surface of the portion 140A, the space above the area 110A1 may be used effectively. In other words, by mounting the components 150 on the portion 140A, it is possible to increase the density.

As in conventional devices, in a configuration in which two rigid substrates are disposed facing each other, a space that is not capable of being utilized is created in the space between the two rigid substrates due to the difference in heights of the electronic components and the like.

Conversely, in the electronic device 100 of the embodiment, since the flexible substrate 140 is attached by lamination to the wiring substrate 110 on which the components 120 are mounted, the flexible substrate 140 may, while coinciding with the heights of the components 120, be adhered on the upper portions of the plurality of components 120 (121 and 122) that have different heights.

Moreover, since the components 150 are mounted on the portion 140A disposed inside the area 110A1 where the components 121A with low heights are assembled together, the space that is not capable of being used conventionally may be used effectively.

Accordingly, the embodiment is capable of providing the electronic device 100 in which increase in density is achieved and the manufacturing method of the electronic device 100.

By improving the arrangement of the components 120 so that the area 110A1 is increased, the density may be increased furthermore.

Furthermore, since the components 150 are disposed in the space above the components 121A with low heights, it is possible to achieve both reduction in thickness and increase in density without increasing the thickness of the electronic device 100.

Furthermore, since an increase in density is achieved with a single wiring substrate 110 and a single flexible substrate 140, compared to conventional devices in which two wiring substrates are used, reduction in cost is achieved.

Note that while a mode in which the portion 140A is formed using the support posts 130 has been described above, the support posts 130 do not have to be used. For example, the portion 140A may be in contact with the upper surfaces of the components 121A by adhering the flexible substrate 140 onto the upper surfaces of the components 121A. The components 150 may be mounted on the portion 140A disposed in the above manner. In such a case, the wiring substrate 110 may be designed so that a plurality of components 121A with about the same height is disposed inside the area 110A1, and the components 120 may be disposed.

Figure 9:
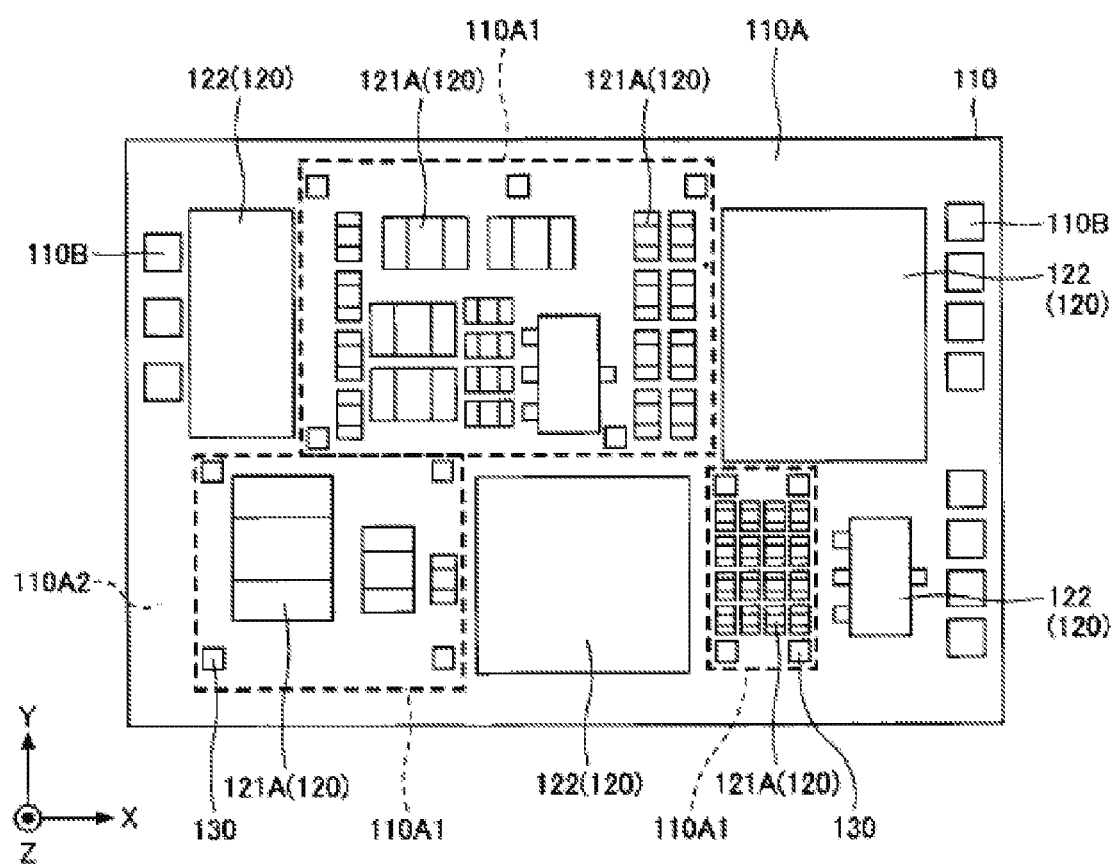
FIG. 9 is a plan view illustrating a wiring substrate, components, and support posts according to a modification of the embodiment.
Figure 10:
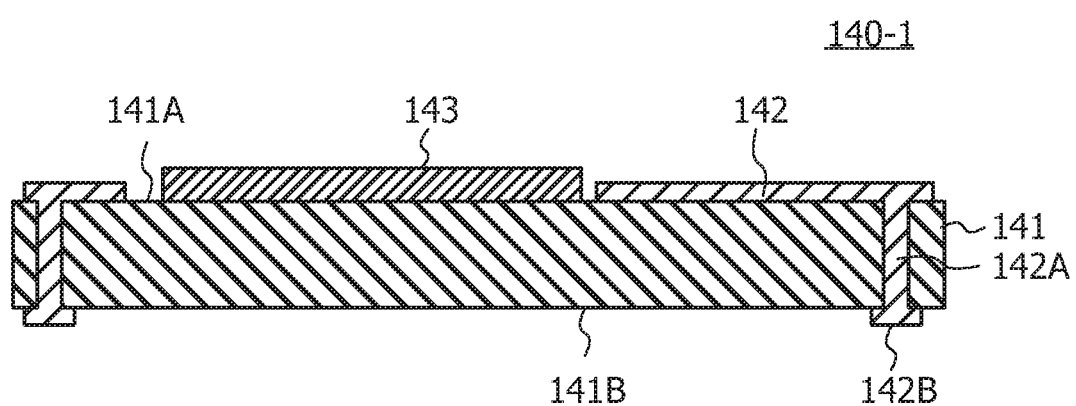
FIG. 10 is a plan view illustrating a flexible substrate according to a modification of the embodiment.
Figure 11:
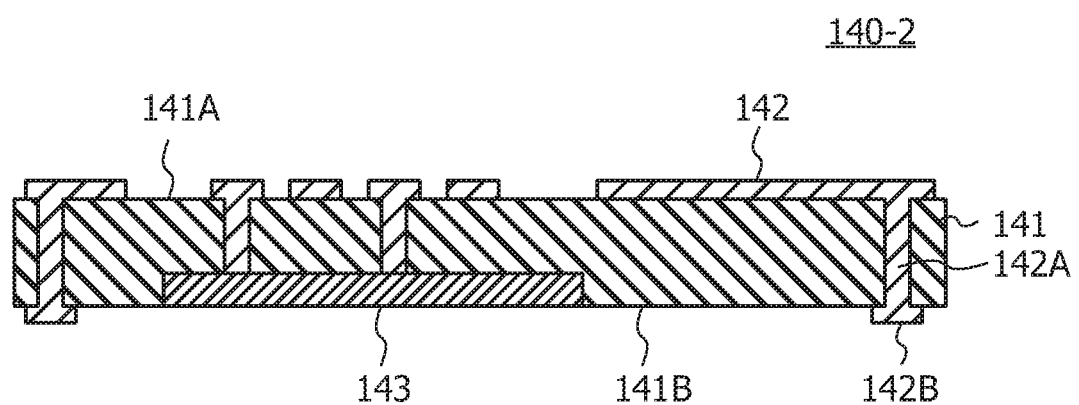
FIG. 11 is a plan view illustrating a flexible substrate according to a modification of the embodiment.

Furthermore, as illustrated in FIGS. 9 to 11, the configuration of the electronic device 100 may be partially modified. FIG. 9 is a plan view illustrating the wiring substrate 110, the components 120, and the support posts 130 according to the modification of the embodiment. FIG. 10 is a plan view illustrating a flexible substrate 140-1 according to a modification of the embodiment. FIG. 11 is a plan view illustrating a flexible substrate 140-2 according to a modification of the embodiment.

A mode in which the electronic device 100 includes a single area 110A1 has been described above; however, as illustrated in FIG. 9, a plurality of areas 110A1 may be arranged and a plurality of portions 140A may be formed by disposing a plurality of metal layers 143 in the flexible substrate 140. Moreover, the components 150 may be mounted on the plurality of portions 140A. In FIG. 9, among the components 121 illustrated as components 121B in FIG. 3, the components 121 included inside the two newly arranged areas 110A1 are denoted as components 121A.

In such a case, the heights of the plurality of portions 140A may be different. In the above case, the arranged portions 140A may be appropriately selected according to the heights of the components 150. Note that, desirably, the upper ends of the components 150 do not exceed the upper end of the component 122 with the highest height.

Furthermore, a mode in which the metal layer 143 of the flexible substrate 140 is disposed in the inner layer has been described above; however, as is the case of the flexible substrate 140-1 illustrated in FIG. 10, the metal layer 143 may be disposed on the surface of the film 141. Furthermore, as is the case of the flexible substrate 140-2 illustrated in FIG. 11, the metal layer 143 may be disposed on the back side of the film 141. In such a case, the metal layer 143 may be, as illustrated in FIG. 11, formed so as to extend inside the film 141 or may be formed on the back side of the film 141 without extending inside the back side.

Furthermore, a mode in which the portion 140A, the rigidity of which is increased by having the flexible substrate 140 include the metal layer 143, is disposed has been described above; however, instead of the metal layer 143, a flexible substrate having a size that is substantially the same as the area 110A1 in plan view may be adhered. Furthermore, the portion 140A, the rigidity of which is increased by partially including a glass cloth, a fine fibrous filler, or the like in the film 141 of the flexible substrate 140, may be disposed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device comprising:
   a wiring substrate;
   a plurality of components having different heights mounted on one surface of the wiring substrate; and
   a flexible substrate, the flexible substrate being formed by laminating on a one surface side of the wiring substrate, that covers the plurality of components, the flexible substrate including a first portion that covers, among the plurality of components, one or more first components that have heights that are equivalent to or lower than a first height, and a second portion that covers, among the plurality of components, one or more second components other than the one or more first components, a first rigidity of the first portion being higher than a second rigidity of the second portion.

2. The electronic device according to claim 1, further comprising:
   support posts having the first height disposed around one or more of the plurality of components on the one surface of the wiring substrate,
   wherein the first portion of the flexible substrate is supported by the support posts.

3. The electronic device according to claim 1,
   wherein the flexible substrate includes a metal layer disposed in the first portion.

4. The electronic device according to claim 1, further comprising:
   a third component that is mounted over the first portion of the flexible substrate.

5. The electronic device according to claim 1,
   wherein a height of an upper end of the third component is equivalent to or lower than a height of an upper end of one of the one or more second components having a highest height.

6. A method for manufacturing an electronic device, comprising:
   disposing a flexible substrate on a one surface side of a wiring substrate in which, among a plurality of components having different heights, one or more first components having heights equivalent to or lower than a first height are mounted over a first area of one surface, and among the plurality of components, one or more second components other than the one or more first components are mounted over a second area of the one surface, the flexible substrate including a first portion corresponding to the first area and a second portion corresponding to the second area, the first rigidity of the first portion being higher than a second rigidity of the second portion, such that the first area and the first portion are positioned so as to coincide with each other and such that the second area and the second portion are positioned so as to coincide with each other; and
   mounting the flexible substrate, by heating and laminating the flexible substrate, over the wiring substrate on which the plurality of components are mounted.

* * * * *